United States Patent
Lee

(10) Patent No.: US 8,212,232 B2
(45) Date of Patent: Jul. 3, 2012

(54) RESISTANCE CHANGING DEVICE AND METHOD FOR FABRICATING THE SAME

(75) Inventor: Yu-Jin Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 188 days.

(21) Appl. No.: 12/697,507

(22) Filed: Feb. 1, 2010

(65) Prior Publication Data

US 2011/0095259 A1 Apr. 28, 2011

(30) Foreign Application Priority Data

Oct. 23, 2009 (KR) .................. 10-2009-0101296

(51) Int. Cl.
*H01L 47/00* (2006.01)
(52) U.S. Cl. ............. 257/4; 257/E27.016; 257/E27.051; 257/E29.327; 257/E29.33; 365/148
(58) Field of Classification Search .................. 257/1, 2, 257/4, 5, 7, 577, E27.016, E27.051, E29.327, 257/E29.33; 365/148, 174, 175
See application file for complete search history.

(56) References Cited

U.S. PATENT DOCUMENTS

| | | | | |
|---|---|---|---|---|
| 7,400,027 B2* | 7/2008 | Joung et al. | ................... | 257/540 |
| 2005/0247921 A1* | 11/2005 | Lee et al. | ......................... | 257/2 |
| 2006/0231887 A1* | 10/2006 | Kim et al. | ....................... | 257/315 |
| 2007/0200158 A1* | 8/2007 | Genrikh et al. | ................ | 257/306 |
| 2007/0267675 A1* | 11/2007 | Cho et al. | ....................... | 257/306 |
| 2009/0052226 A1* | 2/2009 | Lee et al. | ....................... | 365/148 |
| 2009/0116272 A1* | 5/2009 | Kim et al. | ....................... | 365/72 |
| 2009/0309690 A1* | 12/2009 | Kinoshita et al. | ............... | 338/20 |
| 2010/0021626 A1* | 1/2010 | Hsieh et al. | ..................... | 427/77 |
| 2010/0133496 A1* | 6/2010 | Lee et al. | .......................... | 257/2 |

FOREIGN PATENT DOCUMENTS

| KR | 1020050105297 | 11/2005 |
|---|---|---|
| KR | 1020070092502 | 9/2007 |
| KR | 1020070111840 | 11/2007 |

OTHER PUBLICATIONS

Notice of Preliminary Rejection issued from Korean Intellectual Property Office on Feb. 15, 2011.

* cited by examiner

*Primary Examiner* — Evan Pert
*Assistant Examiner* — Eduardo A Rodela
(74) *Attorney, Agent, or Firm* — IP & T Group LLP

(57) ABSTRACT

A resistance changing device includes a resistive layer of a hetero structure interposed between a lower electrode and an upper electrode, and including a plurality of resistive material layers, each having a different resistivity, stacked therein, wherein resistivities of the resistive material layers decrease from the lower electrode toward the upper electrode. Since the resistive layer has a hetero structure in which a plurality of resistive material layers, each having a different resistivity, are stacked in such a manner that the resistivity decreases as it goes from the lower electrode to the upper electrode, it is possible to improve the distributions of the set/reset voltage and the set/reset current, while reducing a reset current of a resistance changing device at the same time.

7 Claims, 4 Drawing Sheets

RESISTANCE CHANGING DEVICE AND METHOD FOR FABRICATING THE SAME

CROSS-REFERENCE TO RELATED APPLICATIONS

The present application claims priority of Korean Patent Application No. 10-2009-0101296, filed on Oct. 23, 2009, which is incorporated herein by reference in its entirety.

BACKGROUND OF THE INVENTION

Exemplary embodiments of the present invention relate to a technology for fabricating a semiconductor device, and more particularly, to a resistance changing device and a fabrication method thereof.

Recently, researchers have been seeking to develop the next-generation memory devices that can replace Dynamic Random Access Memory (DRAM) devices and flash memory devices. Among the next-generation memory devices is a resistive memory device, such as Resistive Random Access Memory (ReRAM) employing a resistance changing device, which rapidly changes a resistance by performing a switching operation between two different resistance states based on an applied voltage.

FIG. 1 is a cross-sectional view illustrating a conventional resistance changing device. Referring to FIG. 1, the conventional resistance changing device includes a lower electrode 11, a resistive layer 13, and an upper electrode 12 sequentially stacked therein. The resistive layer 13 is typically formed of a metal oxide, which includes vacancies inside (e.g., oxygen vacancies).

The resistance changing device, including the lower electrode 11, the resistive layer 13, and the upper electrode 12 sequentially stacked, changes a resistance value by controlling a current and a voltage through a forming process where a predetermined voltage is applied to the lower and upper electrodes 11 and 12. In short, the resistance changing device operates through the forming process.

The switching mechanism of the resistance changing device having the above-described structure will be briefly described herein.

When a bias is applied to the lower and upper electrodes 11 and 12, conductive filaments may be generated through a rearrangement of vacancies in the resistive layer 13 or the vacancies are and, as a result, the conductive filaments generated before are removed based on the applied bias. The resistive layer 13 can represent the two resistance states distinguished by the generation or removal of the conductive filaments in the resistive layer 13. In other words, when the conductive filaments are generated, the resistance changing device represents a low resistance state, and when the conductive filaments are removed, the resistance changing device represents a high resistance state. Herein, an operation for generating the conductive filaments in the resistive layer 13, so that the resistive layer 13 represents the low resistance state is called a set operation. Conversely, an operation for removing the conductive filaments in the resistive layer 13, so that the resistive layer 13 represents the high resistance state is called a reset operation.

However, the conventional technology employing the resistive layer 13 formed of a metal oxide typically has a high reset current magnitude. This causes concern regarding an increase in power consumption of a resistive memory device employing the resistance changing device.

Also, although the resistance changing device generates or removes the conductive filaments through a rearrangement of the vacancies in the resistive layer 13, the resistance changing device hardly forms the vacancies, which are lattice defects, in a uniform distribution in the resistive layer 13. Therefore, there is concern that the distributions of set/reset voltage and set/reset current are not uniform in the resistance changing device. This deteriorates the operation characteristics and reliability of the resistive memory device employing the resistance changing device.

SUMMARY OF THE INVENTION

An embodiment of the present invention is directed to a resistance changing device that can reduce the magnitude of a reset current, and a fabrication method thereof.

Another embodiment of the present invention is directed to a resistance changing device that can improve the distributions of a set/reset voltage and a set/reset current, and a fabrication method thereof.

In accordance with an embodiment of the present invention, a resistance changing device includes a resistive layer of a hetero structure interposed between a lower electrode and an upper electrode, and including a plurality of resistive material layers, each having a different resistivity, stacked therein, wherein resistivities of the resistive material layers decrease from the lower electrode toward the upper electrode.

Each of the resistive material layers may have a thickness in proportion to a resistivity of the resistive material layer. Each of the resistive material layers may include a plurality of vacancies and a plurality of conductive filaments generated from the vacancies and penetrating the resistive material layers. The number of the conductive filaments in each resistive material layer may be in proportion to a resistivity of each resistive material layer, respectively.

The resistive material layers may include a metal oxide. The resistive material layers may include a metal oxide doped with a reduced metal. The reduced metal may have a greater reactivity with oxygen than a metal constituting the metal oxide.

In accordance with another embodiment of the present invention, a resistance changing device includes a resistive layer of a hetero structure where a first resistive material layer is disposed over a lower electrode and a second resistive material layer, having a lower resistivity than the first resistive material layer, is disposed over the first resistive material layer, and an upper electrode disposed over the resistive layer, wherein the first resistive material layer includes a plurality of conductive filaments penetrating the first resistive material layer to connect the lower electrode to the second resistive material layer.

The first and second resistive material layers may include a plurality of vacancies and the conductive filaments may be generated from the vacancies in the first resistive material layer. The second resistive material layer may be thinner than the first resistive material layer. The first and second resistive material layers may include a metal oxide. The first resistive material layer may include a titanium oxide and the second resistive material layer may include a nickel oxide.

The first and second resistive material layers may include a metal oxide doped with a reduced metal. The reduced metal may have a greater reactivity with oxygen than a metal constituting the metal oxide. The first resistive material layer may include a titanium oxide doped with gadolinium and the second resistive material layer may include a nickel oxide doped with titanium.

DESCRIPTION OF SPECIFIC EMBODIMENTS

Figure 1:
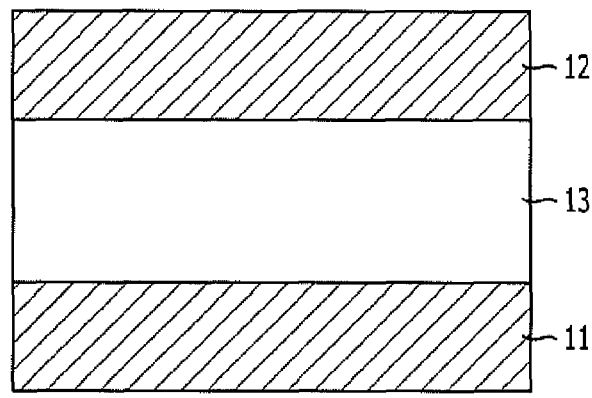
FIG. 1 is a cross-sectional view illustrating a conventional resistance changing device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

The following embodiments of the present invention provide a resistance changing device with improved distributions of the set/reset voltage and the set/reset current that may be applied to a resistive memory device, such as Resistive Random Access Memory (ReRAM). To this end, the embodiments of the present invention provide a resistance changing device, including a resistive layer of a hetero structure, in which a plurality of resistive material layers each having a different resistivity are stacked in such a manner that the resistivity decreases as it goes from a lower electrode to the upper electrode, where the resistive layer is interposed between the lower electrode and the upper electrode.

The lower electrode and the upper electrode may be a single layer formed of any one selected from the group consisting of a conductive inorganic semiconductor material (e.g., polysilicon), a conductive organic semiconductor material (e.g., pentacene), a metal (e.g., platinum (Pt), ruthenium (Ru), aluminum (Al) and iridium (Ir)), a metal nitride (e.g., titanium nitride (TiN), tantalum nitride (TaN), and hafnium nitride (HfN)), and a metal oxide, (e.g., ruthenium oxide ($RuO_2$) and strontium ruthenate ($SrRuO_3$)), or a stacked layer thereof.

The resistive material layers constituting the resistive layer may include a metal oxide or a metal oxide doped with a reduced metal. Herein, the reduced metal is a metal having a greater reactivity with oxygen than the metal constituting the metal oxide. The reduced metal increases the number of oxygen vacancies per unit volume (or density) in the metal oxide, but does not affect the resistivity of the metal oxide. The metal oxide forming the resistive layer may be a metal oxide produced by oxidizing any one metal element selected from the group consisting of nickel (Ni), zinc (Zn), lanthanum (La), niobium (Nb), hafnium (Hf), zirconium (Zr), magnesium (Mg), gadolinium (Gd), and strontium (Sr). Alternatively, the metal oxide forming the resistive layer may be a metal oxide produced by oxidizing an alloy of two or more metal elements. Further, any metal oxide having a variable resistance characteristic other than the above-mentioned metal oxides may be used.

The resistive material layer formed of the metal oxide includes vacancies (e.g., oxygen vacancies) inside, and the resistive material layer may have two resistance states that can be distinguished by the presence/absence of conductive filaments generated/removed based on the vacancies.

The switching mechanism of the resistive memory device having the above structure will be briefly described, hereafter.

When a bias, which may be a set/reset voltage or a set/reset current, is applied to the lower electrode and the upper electrode, the vacancies in the resistive layer may be rearranged to thereby generate conductive filaments, or the vacancies are removed to thereby remove existing conductive filaments based on the applied bias. The resistive layer represents two distinguishable resistance states by the generation or removal of the conductive filaments in the resistive layer. To be specific, when conductive filaments are generated, the resistive layer represents a low resistance state, and when the conductive filaments are removed, the resistive layer represents a high resistance state. Herein, an operation for generating the conductive filaments in the resistive layer, so that the resistive layer represents the low resistance state is called a set operation. Conversely, an operation for removing existing conductive filaments which have already been generated, so that the resistive layer represents the high resistance state is called a reset operation.

Hereafter, the resistive memory device, including the resistive layer of a hetero structure where a plurality of resistive material layers each having a different resistivity are stacked, will be described in detail.

Figure 2:
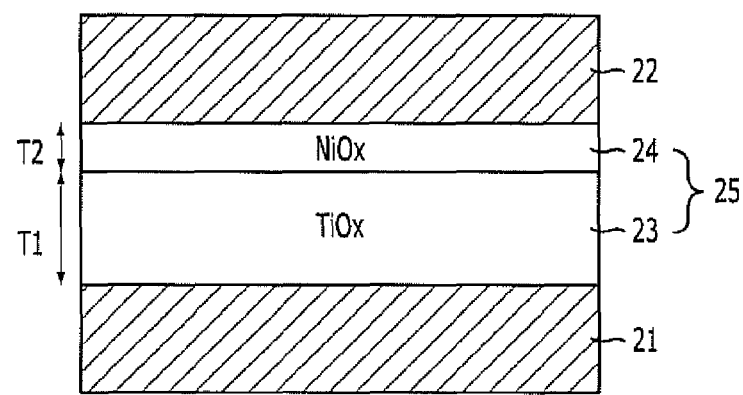
FIG. 2 is a cross-sectional view illustrating a resistance changing device in accordance with a first embodiment of the present invention.

FIG. 2 is a cross-sectional view illustrating a resistance changing device in accordance with a first embodiment of the present invention. Referring to FIG. 2, the resistance changing device according to the first embodiment includes a lower electrode 21 over a substrate (not shown) with a predetermined structure formed therein, a resistive layer 25 of a hetero structure, including a stacked layer where a first resistive material layer 23 is formed over the lower electrode 21 and a second resistive material layer 24, having a resistivity smaller (or lower) than the resistivity of the first resistive material layer 23, is formed over the first resistive material layer 23, and an upper electrode 22 formed over the resistive layer 25. Herein, the first resistive material layer 23 includes a plurality of conductive filaments 26 (see FIG. 3) which connect the lower electrode 21 to the second resistive material layer 24 through the inside of the first resistive material layer 23. Herein, the conductive filaments 26 are generated by the vacancies in the first resistive material layer 23 during a forming process. The conductive filaments are not removed during an operation (i.e., a set operation or a reset operation), and they substantially function as a lower electrode for the second resistive material layer 24 (see FIG. 3).

In other words, in the resistive layer 25 where a plurality of resistive material layers each having a different resistivity are stacked, each of the resistive material layers includes a plurality of vacancies and a plurality of conductive filaments, which are generated from the vacancies during a forming process and penetrate through the resistive material layers. Herein, since the intensity of voltage distributed and applied to each resistive material layer during the forming process is in proportion to the resistivity of the resistive material layer, the number of the conductive filaments generated in the resistive material layer is in proportion to the resistivity of the resistive material layer.

The resistive layer 25 including the first and second resistive material layers 23 and 24, each having a different resistivity, stacked therein may include a metal oxide. In other words, the resistive layer 25 may have a hetero structure including a stacked layer where metal oxide layers each having a different resistivity are stacked therein. For example, when the first resistive material layer 23 is formed of a titanium oxide ($TiO_x$, x being a natural number except 0), the second resistive material layer 24 may be formed of a nickel oxide ($NiO_x$, x being a natural number except 0) having a smaller resistivity than the titanium oxide.

The resistive layer 25 formed of a metal oxide, which are the first and second resistive material layers 23 and 24, includes vacancies (e.g., oxygen vacancies) inside. Herein, since the resistive layer 25 has the hetero structure where the first and second resistive material layers 23 and 24, each having a different resistivity, are stacked, it is possible to prevent the vacancies in the first and second resistive material layers 23 and 24 from being diffused into each other during a process or an operation. In short, it is possible to prevent the vacancies in the first resistive material layer 23 from being diffused into the second resistive material layer 24, or to prevent the vacancies in the second resistive material layer 24 from being diffused into the first resistive material layer 23, thus preventing the vacancy density (i.e., the number of vacancies per unit volume) in the first and second resistive material layers 23 and 24 from being changed due to diffusion.

The first resistive material layer 23 having a greater resistivity than the second resistive material layer 24 includes a plurality of conductive filaments 26 formed therein during a forming process. The conductive filaments 26 in the first resistive material layer 23 substantially function as a lower electrode with respect to the second resistive material layer 24 during an operation to thereby reduce a reset current of the resistance changing device and improve the distributions of the set/reset voltage and the set/reset current.

The second resistive material layer 24 having a smaller resistivity than the first resistive material layer 23 substantially induces a resistance change in the resistive layer 25 in response to the presence/absence of the conductive filaments generated/removed based on the vacancies during an operation, such as a set operation or a reset operation. Herein, since the conductive filaments in the second resistive material layer 24 are generated by taking the conductive filaments generated in the first resistive material layer 23 during the forming process, as seeds, they may have a uniform distribution, and consequently, the distributions of the set/reset voltage and the set/reset current may be improved.

Also, each of the resistive material layers may be formed to a thickness in proportion to the resistivity of the resistive material layer in order to improve the switching speed of the resistance changing device with the resistive layer 25, where a plurality of resistive material layers each having a different resistivity are stacked. To be specific, the second resistive material layer 24 may be thinner than the first resistive material layer 23 (i.e., T1>T2, where T1 is the thickness of the first material layer 23 and T2 is the thickness of the second material layer 24). Through the different thicknesses, the changing speed of the resistance value of the resistive layer 25 during an operation may be improved. While the conductive filaments generated in the first resistive material layer 23 are not removed during an operation, but maintained continuously, the resistive layer 25 has more than two resistance values, which may be distinguished from each other, through an operation of generating/removing the conductive filaments in the second resistive material layer 24. Therefore, the speed of changing the resistance values in the resistive layer 25 can be improved by forming the second resistive material layer 24, so that it is thinner than the first resistive material layer 23.

As described above, although the resistive layer 25 is still formed of a metal oxide, the resistance changing device according to the first embodiment of the present invention can have a reduced reset current, and improved distributions of the set/reset voltage and the set/reset current by forming the resistive layer 25 having the hetero structure, where the first and second resistive material layers 23 and 24, each having a different resistivity, are stacked. This will be described more in detail below with reference to FIG. 3.

Figure 3:
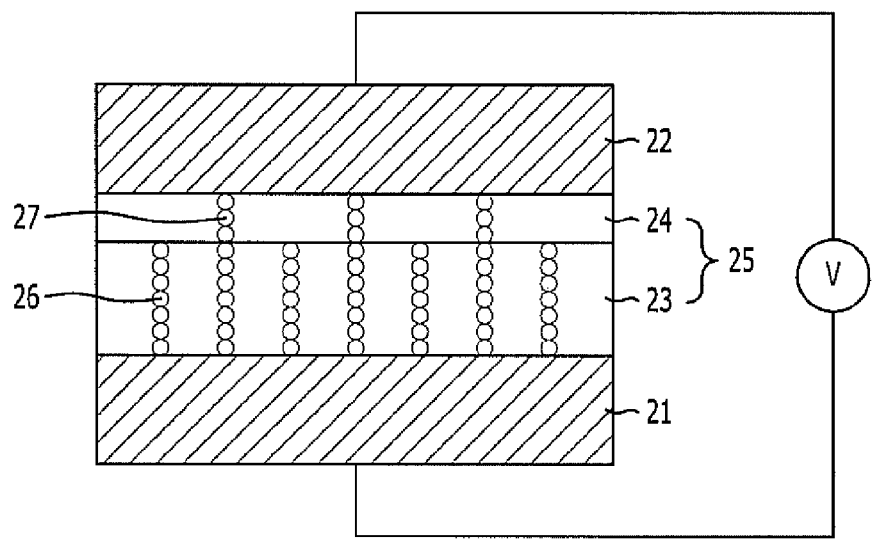
FIG. 3 is a cross-sectional view illustrating conductive filaments generated in a resistive layer during a forming process in the resistance changing device in accordance with the first embodiment of the present invention.

FIG. 3 is a cross-sectional view illustrating conductive filaments generated in a resistive layer during a forming process in the resistance changing device in accordance with the first embodiment of the present invention. Referring to FIG. 3, the resistance changing device is fabricated by sequentially stacking the lower electrode 21, the resistive layer 25, and the upper electrode 22. The resistive layer 25 has a hetero structure, including the first resistive material layer 23 and the second resistive material layer 24, having a smaller resistivity than the first resistive material layer 23, sequentially stacked therein. Subsequently, a forming process of applying a predetermined voltage to the lower and upper electrodes 21 and 22 is performed. Herein, since the first resistive material layer 23 has a greater resistivity (or initial resistance) than the second resistive material layer 24, soft breakdown occurs in part of the first resistive material layer 23 during the forming process. In other words, due to the difference in the resistivities during the forming process, most of the applied voltage is loaded on the first resistive material layer 23, having a greater resistivity, and, as a result, a relatively large number of first conductive filaments 26 are formed in the first resistive material layer 23. On the other hand, a relatively small number of second conductive filaments 27 are formed in the second resistive material layer 24, having a relatively smaller resistivity, to which a relatively low voltage is applied.

When a set operation is performed after the forming process, the first conductive filaments 26, generated in the first resistive material layer 23, substantially function as a lower electrode with respect to the second resistive material layer 24 to thereby realize an effect of decreasing an active area during the set operation.

In other words, the number of the second conductive filaments 27, generated in the second resistive material layer 24 during an operation, may be reduced by realizing the effect of reducing the area of the lower electrode contacting the second resistive material layer 24. As a result, as the number of the second conductive filaments 27, generated in the second resistive material layer 24, decreases, the reset current of the resistance changing device may be reduced even though the resistive layer 25 is formed of a metal oxide.

Also, the second conductive filaments 27 of the second resistive material layer 24 are generated during an operation by taking the first conductive filaments 26 already generated in the first resistive material layer 23 during the forming process as their seeds. Thus, the second conductive filaments 27 may have more uniform shape and distribution in the second resistive material layer 24 during the operation than those generated from a planar electrode. To be specific, although the distribution of vacancies is not uniform in the second resistive material layer 24, conductive filaments of a uniform shape and distribution may be formed in the second resistive material layer 24 during the operation by taking the conductive filaments of the first resistive material layer 23 as the seeds. In this way, the distributions of the set/reset voltage and the set/reset current of the resistance changing device may be improved.

Hereafter, a resistance changing device capable of improving the distributions of the set/reset voltage and the set/reset current of the resistance changing device will be described in accordance with a second embodiment of the present invention. For the sake of convenience in explanation, what is the same as or similar to that of the first embodiment will not be described in detail in the following description of the second embodiment.

Figure 4:
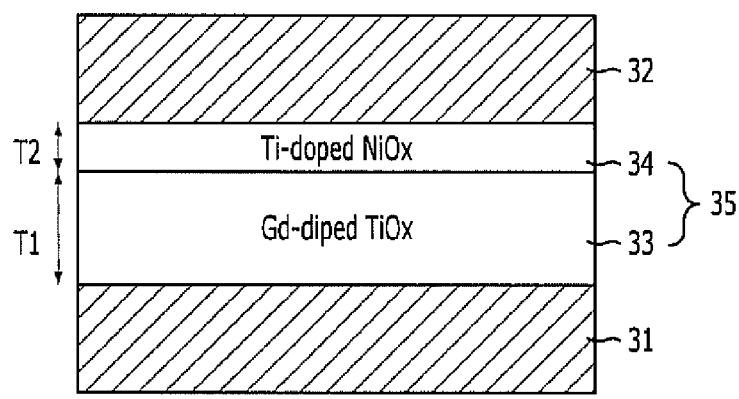
FIG. 4 is a cross-sectional view illustrating a resistance changing device in accordance with a second embodiment of the present invention.

FIG. 4 is a cross-sectional view illustrating a resistance changing device in accordance with the second embodiment of the present invention. Referring to FIG. 4, the resistance changing device includes a lower electrode 31, a resistive layer 35, and an upper electrode 32. The resistive layer 35 has a hetero structure, including a first resistive material layer 33 and a second resistive material layer 34 sequentially stacked therein. The first resistive material 33 is doped with a first reduced metal and a second resistive material layer 34 has a smaller resistivity than the first resistive material layer 33 and is doped with a second reduced metal. The upper electrode 32 is formed over the resistive layer 35. Herein, the first resistive material layer 33 includes a plurality of conductive filaments connecting the lower electrode 31 to the second resistive material layer 34 through the first resistive material layer 33 therein. Since the conductive filaments are generated from vacancies in the first resistive material layer 33 during a forming process, the conductive filaments are not removed during an operation, which is a set operation or a reset operation. Moreover, the first resistive material layer 33, having the conductive filaments, substantially functions as a lower electrode with respect to the second resistive material layer 34 (see FIG. 3).

The resistive layer 35 may include a metal oxide with the first and second resistive material layers 33 and 34, doped with first and second reduced metals, respectively, stacked therein. Herein, the first and second reduced metals are metals having a greater reactivity with oxygen than the metal constituting the first and second resistive material layers 33 and 34. Further, the first and second reduced metals increase the number of oxygen vacancies per unit volume (or vacancy density), in the first and second resistive material layers 33 and 34. However, the first and second reduced metals do not affect the resistivity of the first and second resistive material layers 33 and 34. In other words, the resistivity of the first and second resistive material layers 33 and 34 is not changed by doping the first and second reduced metals.

For example, the first resistive material layer 33 doped with the first reduced metal may be a titanium oxide (TiO$_x$, x being a natural number except 0) doped with gadolinium, whereas the second resistive material layer 34 doped with the second reduced metal may be a nickel oxide (NiO$_x$, x being a natural number except 0) doped with titanium.

The resistive layer 35 formed of a metal oxide doped with a reduced metal may increase the number of oxygen vacancies per unit volume (or vacancy density) more than that of the first embodiment. Therefore, the non-uniform distribution of the vacancies in the resistive layer 35 may be improved by doping the resistive layer 35 with a reduced metal. As a result, the distributions of the set/reset voltage and the set/reset current of the resistance changing device may be improved more effectively in this embodiment than in the first embodiment of the present invention.

The resistive layer 35 including a metal oxide, which is a stack of the first resistive material layer 33 and the second resistive material layer 34, contains vacancies inside (e.g., oxygen vacancies). Herein, since the resistive layer 35 has a hetero structure, where the first and second resistive material layers 33 and 34 each having a different resistivity are stacked, the vacancies of the first and second resistive material layers 33 and 34 are kept away from being diffused into each other.

The first resistive material layer 33, which has a greater resistivity than the second resistive material layer 34, includes a plurality of conductive filaments formed therein during a forming process. The plurality of the conductive filaments in the first resistive material layer 33 substantially function as a lower electrode with respect to the second resistive material layer 34 during an operation to thereby reduce the reset current of the resistance changing device and improve the distributions of the set/reset voltage and the set/reset current of the resistance changing device.

The second resistive material layer 34 having a smaller resistivity than the first resistive material layer 33 substantially induces a resistance change in the resistive layer 35 distinguished by the presence/absence of the conductive filaments generated/removed based on the vacancies during an operation, such as a set operation or a reset operation. Herein, since the conductive filaments in the second resistive material layer 34 are generated by taking the conductive filaments generated in the first resistive material layer 33 during the forming process as seeds, they may have a uniform distribution, and consequently, the distributions of the set/reset voltage and the set/reset current may be improved.

Also, the second resistive material layer 34 may be thinner than the first resistive material layer 33 (i.e., T1>T2, where T1 is the thickness of the first resistive material layer 33 and T2 is the thickness of the second resistive material layer 34). As a result of the different thicknesses, the changing speed of the resistance value of the resistive layer 35 during an operation may be improved. To be specific, while the conductive filaments generated in the first resistive material layer 33 are not removed during an operation, but maintained continuously, the resistive layer 35 has more than two resistance values, which may be distinguished from each other, through an operation of generating/removing the conductive filaments generated in the second resistive material layer 34 based on the conductive filaments generated in the first resistive material layer 33, which are taken as seeds. Therefore, the speed of changing the resistance values in the resistive layer 35 can be improved by forming the second resistive material layer 34 thinner than the first resistive material layer 33.

As described above, although the resistive layer 35 is still formed of a metal oxide, the resistance changing device according to the second embodiment of the present invention can have a reduced reset current, and improved distributions of the set/reset voltage and the set/reset current by forming the resistive layer 35 with a hetero structure where the first and second resistive material layers 33 and 34, each having a different resistivity, are stacked.

Also, as the first and second resistive material layers 33 and 34 constituting the resistive layer 35 are doped with the first and second reduced metals, respectively, the distributions of the set/reset voltage and the set/reset current of the resistance changing device may be improved.

Figure 5A:
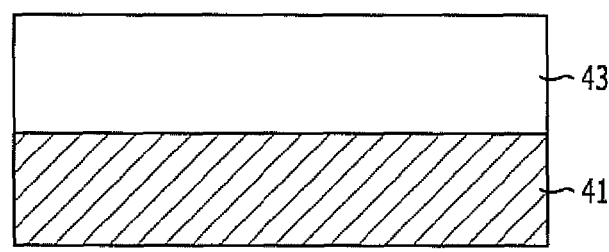
FIGS. 5A to 5D are cross-sectional views describing a method for fabricating a resistance changing device in accordance with a third embodiment of the present invention.

FIGS. 5A to 5D are cross-sectional views describing a method for fabricating a resistance changing device in accordance with a third embodiment of the present invention. Referring to FIG. 5A, after a lower electrode 41 is formed, a first resistive material layer 43 is formed over the lower electrode 41. Herein, the first resistive material layer 43 may be formed of a metal oxide or a metal oxide doped with a reduced metal. The reduced metal is a metal having a greater reactivity with oxygen than the metal constituting the metal oxide.

For example, the first resistive material layer 43 may be formed of a titanium oxide or a titanium oxide doped with gadolinium (Gd), which has a higher reactivity with oxygen than titanium. When the first resistive material layer 43 is formed of the titanium oxide doped with gadolinium (Gd), the first resistive material layer 43 may be formed by performing a series of forming processes of depositing a titanium oxide over the lower electrode 41 and implanting Gd ions into the titanium oxide. On the other hand, the first resistive material layer 43 may be formed by performing an alternate deposition method where a titanium oxide target and a Gd target are alternately sputtered.

Figure 5B:
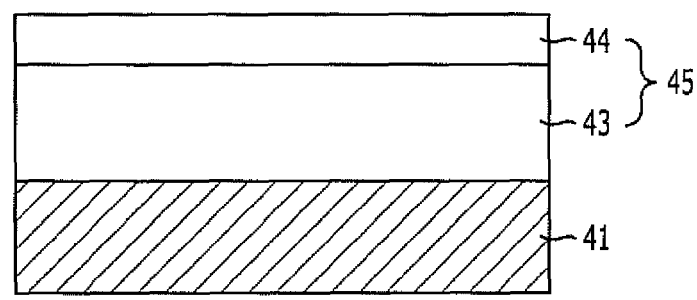

Referring to FIG. 5B, a second resistive material layer 44 having a smaller resistivity than the first resistive material layer 43 is formed over the first resistive material layer 43. Herein, the second resistive material layer 44 may be formed of a metal oxide or a metal oxide doped with a reduced metal, like the first resistive material layer 43. For example, when the first resistive material layer 43 is formed of a titanium oxide, the second resistive material layer 44 may be formed of a nickel oxide having a smaller resistivity than the titanium oxide, or a nickel oxide doped with titanium having a greater reactivity with oxygen than nickel.

Through the above-described process, it is possible to form a resistive layer 45 of a hetero structure including a stacked layer where the first and second resistive material layers 43 and 44, each having a different resistivity, are stacked. Herein, the second resistive material layer 44 may be formed thinner than the first resistive material layer 43 (i.e., T1>T2 where T1 is the thickness of the first resistive material layer 43 and T2 is the thickness of the second resistive material layer 44). When the second resistive material layer 44 is formed thinner than the first resistive material layer 43, the speed of changing the resistance value of the resistive layer 45 may be improved during subsequent set and reset operations.

Figure 5C:
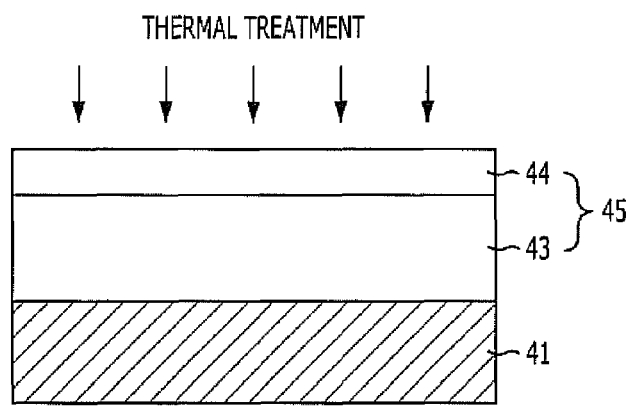

Referring to FIG. 5C, a thermal treatment is performed to thereby form a plurality of vacancies (e.g., oxygen vacancies) in the first resistive material layer 43 and the second resistive material layer 44.

The thermal treatment performed to form the vacancies may be a furnace treatment or a rapid thermal treatment, and it may be performed at a temperature ranging from approximately 300° C. to approximately 800° C. Also, the thermal treatment may be performed in a vacuum or in the atmosphere of any gas selected from the group consisting of nitrogen gas ($N_2$), hydrogen gas ($H_2$), ammonia gas ($NH_3$), and a gas mixture thereof. Herein, the nitrogen gas, the hydrogen gas, and the ammonia gas function as a reducing gas for an oxygen component in the metal oxide constituting the first and second resistive material layers 43 and 44.

Herein, the vacancies (e.g., oxygen vacancies) are generated in the resistive layer 45 through the thermal treatment. More specifically, the bond between metal and oxygen in the resistive layer 45 is broken by heat energy applied to the resistive layer 45, and the oxygen that breaks free from the bond comes out of the resistive layer 45 to be volatilized and removed, leaving oxygen vacancies in the places where the oxygen used to be bound in the resistive layer 45. Herein, when the thermal treatment is performed in the atmosphere of the reducing gas, such as nitrogen gas, hydrogen gas, and ammonia gas, the separation of the oxygen bond and the volatilization of the free oxygen in the resistive layer 45 become easy thereby improving the efficiency of generating the vacancies in the resistive layer 45.

Also, since the reduced metal doping the first and second resistive material layers 43 and 44 is activated by the heat energy, the vacancy generation efficiency and the number of the vacancies per unit volume (or vacancy density) in the first and second resistive material layers 43 and 44 may be increased.

In addition to the thermal treatment, the distribution of the vacancies in the resistive layer 45 may be improved by increasing the number of vacancies per unit volume (or vacancy density) in the resistive layer 45 through the use of a metal oxide doped with a reduced metal. Thus, the distributions of the set/reset voltage and the set/reset current of the resistance changing device are improved.

Figure 5D:
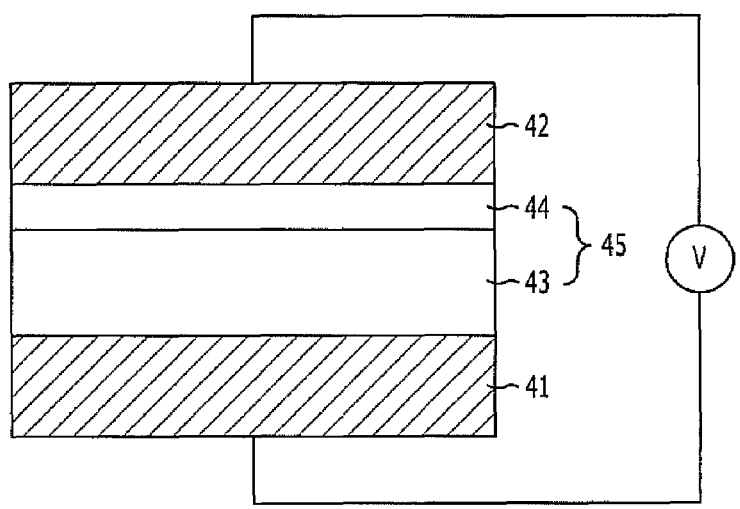

Referring to FIG. 5D, a forming process of forming an upper electrode 42 over the resistive layer 45 and applying a predetermined voltage to the lower and upper electrodes 41 and 42 is performed. The forming process is a process of forming the initial conductive filaments in the resistive layer 45, so that the resistance changing device has more than two distinguishable resistance states in response to a bias, such as a set/reset voltage or set/reset current, applied thereto. In other words, the forming process is a process of forming conductive filaments in the resistive layer 45 that allow a switching operation to be performed.

Herein, most of the applied voltage is loaded on the first resistive material layer 43 having a greater resistivity than the second resistive material layer 44. As a result, a relatively large number of conductive filaments are formed in the first resistive material layer 43. On the other hand, a relatively small number of conductive filaments are formed in the second resistive material layer 44, having a relatively smaller resistivity, to which a relatively low voltage is applied. Herein, the relatively large number of conductive filaments generated in the first resistive material layer 43 during the forming process are not removed during the subsequent set and reset operations. Further, the conductive filaments in the first resistive material layer 43 substantially function as a lower electrode with respect to the conductive filaments generated in the second resistive material layer 44 during the set/reset operations to thereby reduce the magnitude of the reset current, while improving the distributions of the set/reset voltage and the set/reset current of the resistance changing device (see FIG. 3).

According to the embodiments of the present invention, since the resistive layer has a hetero structure in which a plurality of resistive material layers, each having a different resistivity, are stacked in such a manner that the resistivity decreases as it goes from the lower electrode to the upper electrode, it is possible to improve the distributions of the set/reset voltage and the set/reset current, while reducing a reset current of a resistance changing device at the same time.

Also, the distributions of the set/reset voltage and the set/reset current may be improved more effectively when the resistive layer is formed of a metal oxide doped with a reduced metal.

While the present invention has been described with respect to the specific embodiments, it will be apparent to those skilled in the art that various changes and modifications may be made without departing from the spirit and scope of the invention as defined in the following claims.

What is claimed is:

1. A resistance changing device, comprising:
a resistive layer of a hetero structure including a first resistive material layer and a second resistive material layer, wherein the first resistive material layer is disposed over a lower electrode, the second resistive material layer is disposed over the first resistive material layer, and the second resistive material layer has a lower resistivity than the first resistive material layer; and an upper electrode disposed over the resistive layer, wherein the first resistive material layer includes a plurality of conductive filaments penetrating the first resistive material layer to connect the lower electrode to the second resistive material layer, wherein the second resistive material layer is thinner than the first resistive material layer.

2. The resistance changing device of claim 1, wherein the first and second resistive material layers include a plurality of vacancies and the conductive filaments are generated from the vacancies in the first resistive material layer.

3. The resistance changing device of claim 1, wherein the first and second resistive material layers include a metal oxide.

4. The resistance changing device of claim 3, wherein the first resistive material layer includes a titanium oxide and the second resistive material layer includes a nickel oxide.

5. The resistance changing device of claim 1, wherein the first and second resistive material layers include a metal oxide doped with a reduced metal.

6. The resistance changing device of claim 5, wherein the reduced metal has a greater reactivity with oxygen than a metal constituting the metal oxide.

7. The resistance changing device of claim 6, wherein the first resistive material layer includes a titanium oxide doped with gadolinium and the second resistive material layer includes a nickel oxide doped with titanium.

* * * * *